United States Patent
Kraus et al.

(10) Patent No.: US 11,428,752 B2
(45) Date of Patent: Aug. 30, 2022

(54) IN-SITU TESTING OF ELECTRIC DOUBLE LAYER CAPACITORS IN ELECTRIC METERS

(71) Applicant: Landis+Gyr Innovations, Inc., Alpharetta, GA (US)

(72) Inventors: Matthew E. Kraus, Jamestown, IN (US); Frank J. Boudreau, Jr., Otterbein, IN (US)

(73) Assignee: LANDIS+GYR INNOVATIONS, INC., Alpharetta, GA (US)

( * ) Notice: Subject to any disclaimer, the term of this patent is extended or adjusted under 35 U.S.C. 154(b) by 0 days.

(21) Appl. No.: 17/022,684

(22) Filed: Sep. 16, 2020

(65) Prior Publication Data
US 2022/0082637 A1   Mar. 17, 2022

(51) Int. Cl.
*G01R 31/64* (2020.01)
*G01R 27/26* (2006.01)
(Continued)

(52) U.S. Cl.
CPC .......... *G01R 31/64* (2020.01); *G01R 27/2605* (2013.01); *G06Q 50/06* (2013.01); *G01R 27/26* (2013.01); *G01R 31/50* (2020.01)

(58) Field of Classification Search
CPC ........ G01R 31/00; G01R 31/50; G01R 31/64; G01R 27/00; G01R 27/02; G01R 27/26; G01R 27/2605; G06Q 50/00; G06Q 50/06
(Continued)

(56) References Cited

U.S. PATENT DOCUMENTS 4,713,604 A * 12/1987 Becker .................... H02H 7/16
324/500
4,968,944 A * 11/1990 Zucker .................... H02H 3/04
324/127
(Continued)

FOREIGN PATENT DOCUMENTS

CA   2034390 A1 * 10/1991 ......... G01R 21/1333
EP   2290383       3/2011
(Continued)

OTHER PUBLICATIONS

Abdennadher et al., "A Real Time Predictive Maintenance System of Aluminum Electrolytic Capacitors Used in Uninterrupted Power Supplies", Industry Applications Society Annual Meeting, Oct. 2008, pp. 1-6.
(Continued)

*Primary Examiner* — Hoai-An D. Nguyen
(74) *Attorney, Agent, or Firm* — Kilpatrick Townsend & Stockton LLP

(57) ABSTRACT

A method for determining degradation of a capacitor in an electric meter includes, charging the capacitor to a predetermined voltage value during a charging period using charging circuitry of the electric meter, discharging the capacitor, during a discharge period, from the predetermined voltage value using discharging circuitry of the electric meter, measuring, during the discharge period, a first capacitor voltage value at a first time and a second capacitor voltage value at a second time later than the first time using capacitor measurement circuitry of the electric meter, determining, by a processor of the electric meter, a capacitance value of the capacitor based on the first voltage value, the second voltage value, the first time, and the second time, comparing the determined capacitance value to a capacitance threshold value, and determining that the capacitor is
(Continued)

in a degraded condition when the calculated capacitance value is below the capacitance threshold value.

22 Claims, 6 Drawing Sheets

(51) Int. Cl.
  *G06Q 50/06* (2012.01)
  *G01R 31/50* (2020.01)
(58) Field of Classification Search
  USPC ....... 324/500, 537, 548, 555, 600, 649, 658, 324/679, 684, 686
  See application file for complete search history.

(56) References Cited

U.S. PATENT DOCUMENTS

| | | | | |
|---|---|---|---|---|
| 4,970,503 | A * | 11/1990 | Principe | G06F 11/0757 340/642 |
| 5,818,125 | A * | 10/1998 | Manchester | H02J 9/06 307/66 |
| 7,629,823 | B2 * | 12/2009 | Wang | H03K 7/08 327/170 |
| 9,651,597 | B1 * | 5/2017 | Lee | G06K 7/10366 |
| 9,846,185 | B2 * | 12/2017 | Nagaraj | G01R 27/2605 |
| 2006/0267599 | A1 * | 11/2006 | Pooranakaran | G01R 27/2605 324/681 |
| 2009/0033345 | A1 * | 2/2009 | Picard | H04L 12/10 324/705 |
| 2011/0202217 | A1 * | 8/2011 | Kempton | H02J 3/008 701/22 |
| 2013/0021021 | A1 | 1/2013 | Ramirez | |
| 2015/0130273 | A1 * | 5/2015 | Govindaraj | B60L 50/10 307/10.1 |
| 2016/0266189 | A1 * | 9/2016 | Yoshida | G01R 31/64 |
| 2017/0134022 | A1 * | 5/2017 | Kim | G06F 3/0418 |
| 2017/0322262 | A1 | 11/2017 | Armstrong, II | |
| 2019/0094279 | A1 * | 3/2019 | Ou Yang | H02M 1/42 |
| 2021/0034128 | A1 * | 2/2021 | Suljic | G06F 3/0634 |
| 2021/0099102 | A1 * | 4/2021 | Tahata | H02M 1/088 |

FOREIGN PATENT DOCUMENTS

| | | |
|---|---|---|
| EP | 2963796 | 1/2016 |
| EP | 3462588 | 4/2019 |
| EP | 3633841 | 4/2020 |

OTHER PUBLICATIONS

International Patent Application No. PCT/US2021/050391, International Search Report and Written Opinion dated Dec. 10, 2021, 14 pages.

\* cited by examiner

IN-SITU TESTING OF ELECTRIC DOUBLE LAYER CAPACITORS IN ELECTRIC METERS

BACKGROUND

Unless otherwise indicated herein, the materials described in this section are not prior art to the claims in this application and are not admitted to be prior art by inclusion in this section.

An electric meter measures electrical power consumed by a customer of an electric utility provider. The electric meter is plugged into a meter socket that is mounted in an enclosure on a building or other structure, and draws its operating power from the electrical power distribution grid. Electric meters record electric energy consumption and communicate the information as well as status information of the meter itself to the utility provider for monitoring and billing. When power outages occur, an electric meter no longer has the ability to communicate with the utility provider.

In order to enable the electric meter to provide a "last gasp" communication to the utility provider when a power outage occurs, electric meters may be equipped with a back-up power supply. The back-up power supply may provide power to the electric meter only for a brief period of time sufficient for the meter to transmit the last gasp communication. The back-up power supply may be a capacitor, for example, an electric double layer capacitor (EDLC), also referred to as an ultracapacitor or supercapacitor.

SUMMARY

Systems and methods for measuring capacitance values and estimating equivalent series resistance values for capacitors installed in electric meter socket connections are provided.

According to various aspects there is provided a method for determining degradation of a capacitor in an electric meter. In some aspects, the method may include: charging the capacitor to a predetermined voltage value during a charging period using charging circuitry of the electric meter; discharging the capacitor, during a discharge period, from the predetermined voltage value using discharging circuitry of the electric meter; measuring, during the discharge period, a first voltage value of the capacitor at a first time and a second voltage value of the capacitor at a second time later than the first time using measurement circuitry of the electric meter; determining, by a processor of the electric meter, a capacitance value of the capacitor based on the first voltage value, the second voltage value, the first time, and the second time; comparing the determined capacitance value to a capacitance threshold value; and determining that the capacitor is in a degraded condition when the calculated capacitance value is below the capacitance threshold value.

The method may further include generating a notification to a head-end system that the capacitor is in a degraded condition. The capacitance threshold may be determined based on historical empirical capacitance data. The charging circuitry may be a constant voltage charging circuit or a constant current charging circuit. The discharging circuitry may be a constant load discharging circuit or a constant current discharging circuit.

The method may further include estimating an equivalent series resistance (ESR of the capacitor by: performing capacitor voltage measurements at a start of the discharge period, wherein the capacitor voltage measurements are performed over a series of time intervals shorter than a time interval between the first time and the second time; determining a change in slope of capacitor voltage based on the capacitor voltage measurements performed over the series of time intervals; and estimating the ESR of the capacitor based on the capacitor voltage measurements obtained between the start of the discharge period and a point of the change in slope of the capacitor voltage.

The charging, discharging, and measuring of the capacitor voltage may be performed on a predetermined schedule or in response to a command received by the electric meter. The capacitor may be an electric double layer capacitor (EDLC).

According to various aspects there is provided an electric meter. In some aspects, the electric meter may include: a capacitor; capacitor charging circuitry; capacitor discharging circuitry; measurement circuitry; and a processor. The processor may be configured to: cause the capacitor charging circuitry to charge the capacitor to a predetermined voltage value during a charging period; cause the capacitor discharging circuitry to discharge the capacitor from the predetermined voltage value during a discharge period; cause the measurement circuitry to measure, during the discharge period, a first voltage value of the capacitor at a first time and a second voltage value of the capacitor at a second time later than the first time; calculate a capacitance of the capacitor based on the first voltage value, the second voltage value, the first time, and the second time; and compare the calculated capacitance to a capacitance threshold value.

The processor may be further configured to generate a notification to a head-end system that the capacitor is in a degraded condition. The capacitance threshold value may be determined based on historical empirical capacitance data.

The charging circuit may be a constant voltage charging circuit or a constant current charging circuit. The discharging circuitry may be a constant load discharging circuit or a constant current discharging circuit.

The processor may be is further configured to estimate an equivalent series resistance (ESR) of the capacitor by: causing the measurement circuitry to perform capacitor voltage measurements at a start of the discharge period, wherein the capacitor voltage measurements are performed over a series of time intervals shorter than a time interval between the first time and the second time; determine a change in slope of capacitor voltage based on the capacitor voltage measurements performed over the series of time intervals; and estimate the ESR of the capacitor based on the capacitor voltage measurements obtained between the start of the discharge period and a point of the change in slope of the capacitor.

The processor may be further configured to perform the charging, discharging, and measuring of the capacitor voltage on a predetermined schedule or in response to a command received by the electric meter. The capacitor may be an electric double layer capacitor (EDLC).

According to various aspects there is provided a system. In some aspects, system may include: a head-end system including a first processor; and an electric meter coupled to the head-end system via a network. The electric meter may include: a capacitor; capacitor charging circuitry; capacitor discharging circuitry; measurement circuitry; and a second processor. The second processor may be configured to, upon receiving a command transmitted by the head-end system: cause the capacitor charging circuitry to charge the capacitor to a predetermined voltage value during a charging period; cause the capacitor discharging circuitry to discharge the capacitor from the predetermined voltage value during a discharge period; cause the measurement circuitry to measure, during the discharge period, a first voltage value of the capacitor at a first time and a second voltage value of the capacitor at a second time later than the first time; determine a capacitance value of the capacitor based on the first voltage value, the second voltage value, the first time, and the second time; and in response to the command received from the head-end system, transmit the determined capacitance value to the head-end system.

The first processor of the head-end system may be configured to: receive the transmitted capacitance value from the electric meter; compare the determined capacitance value to a capacitance threshold value; and determine that the capacitor is in a degraded condition when the determined capacitance value is below the capacitance threshold value.

The second processor of the head-end system may be further configured to generate a notification that the capacitor is in a degraded condition. The capacitance threshold value may be determined based on historical empirical capacitance data. The capacitor may be an electric double layer capacitor (EDLC).

Numerous benefits are achieved by way of the various embodiments over conventional techniques. For example, the various embodiments provide apparatuses and methods that can be used to proactively perform maintenance on an electric meter having a degraded capacitor. In some embodiments, notifications regarding the health (e.g., capacitance value) of the capacitor based on the capacitor voltage measurements may be periodically transmitted to a head-end system by the electric meter. These and other embodiments along with many of its advantages and features are described in more detail in conjunction with the text below and attached figures.

BRIEF DESCRIPTION OF THE DRAWINGS

Aspects and features of the various embodiments will be more apparent by describing examples with reference to the accompanying drawings, in which.

DETAILED DESCRIPTION

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

An electric meter measures electrical power consumed by a customer of an electric utility provider. The electric meter is plugged in to a meter socket that is mounted in an enclosure on a building or other structure and provides a connection between the electric power delivered by the electrical utility and the customer. The electric meter measures and controls the electricity delivered to the customer premises via the grid. The electric meter may be combined with a communications module to enable the meter to communicate with other meters and with the utility. The electric meter may be part of a utility management system.

Electric meters may be equipped with a back-up power supply to provide power to the electric meter only for a brief period of time sufficient for the meter to transmit a "last gasp" communication during a power outage. The back-up power supply may be a capacitor, for example, an electric double layer capacitor (EDLC), also referred to as an ultracapacitor or supercapacitor. In order to ensure that the capacitor of electric meter is capable of providing sufficient power for a last gasp communication, such as an indication of a power outage, the condition of the capacitor should be monitored.

Figure 1:
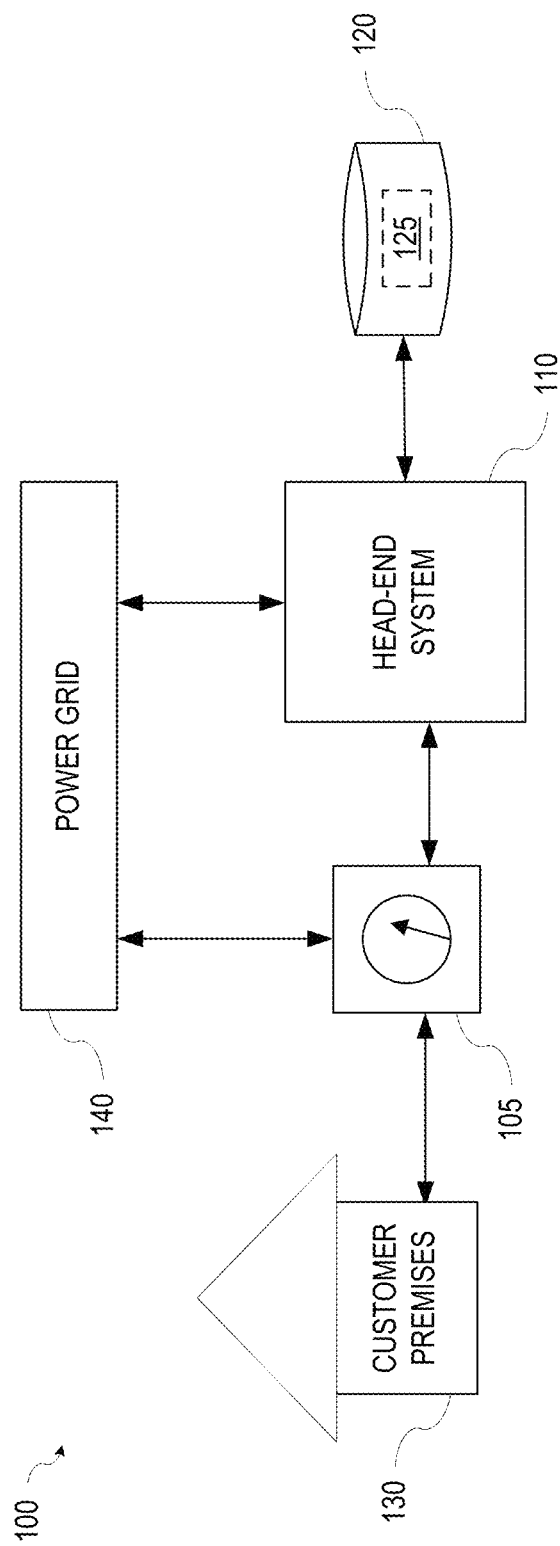
FIG. 1 is diagram illustrating a utility management system according to some aspects of the present disclosure.

FIG. 1 is a diagram illustrating a utility management system 100 according to various aspects of the present disclosure. Referring to FIG. 1, the utility management system 100 may include an electric meter 105, a head-end system 110, and a storage device 120. While FIG. 1 illustrates one electric meter 105 for ease of explanation, one of ordinary skill in the art will appreciate that a plurality of electric meters 105 may be included in the disclosed utility management system 100 without departing from the scope of the present disclosure.

The electric meter 105 may monitor and/or record the energy usage at the customer premises 130 and communicate the information about energy usage to the head-end system 110. For example, the electric meter 105 may continually monitor and record total energy usage at the customer premises 130. In accordance with various aspects of the present disclosure, the electric meter 105 may monitor and/or record days of the week and times of the day related to energy usage at the customer premises 130 and communicate the information to the head-end system 110. In addition, the electric meter 105 may perform as a sensor to detect and/or record abnormal measurements and/or events, for example, but not limited to, power outages. One of ordinary skill in the art will appreciate that other information, for example, but not limited to, average power consumed, peak power, etc., may be monitored and communicated by the electric meter 105.

The electric meter 105 may communicate with the head-end system 110 via wired or wireless communication interfaces known to those of skill in the art using communication protocols appropriate to the specific communication interface. Different wired or wireless communication interfaces and associated communication protocols may be implemented on the electric meter 105 for communication with the head-end system 110. For example, in some embodiments a wired communication interface may be implemented, while in other embodiments a wireless communication interface may be implemented for communication between the electric meter 105 and the head-end system 110. In some embodiments, a wireless mesh network may connect a plurality of electric meters 105. The plurality of electric meters 105 may transmit data to a collector (not shown) that communicates with another network to transmit the data to the head-end system 110. The electric meters 105 may use radio frequency (RF), cellular, or power line communication to communicate. One of ordinary skill in the art will appreciate that other communication methods may be used without departing from the scope of the present disclosure.

The head-end system 110 may include a storage device 120. The storage device 120 may be, for example, but not limited to, one or more hard-disk drives, solid-state memory devices, or other computer-readable storage media. One of ordinary skill in the art will appreciate that other storage configurations may be used without departing from the scope of the present disclosure. A database 125 may be stored on the storage device 120. The database 125 may store information collected from the electric meters 105. For example, the database 125 may include days of the week and times of the day correlating with load is operating information, for example, but not limited to, average power consumed by the load, peak power consumed by the load, etc. One of ordinary skill in the art will appreciate that this information is exemplary and that other information may be included in the database 125 without departing from the scope of the present disclosure.

The head-end system 110 and the electric meter 105 may be connected to an electrical power distribution grid 140. The electrical power distribution grid 140 may include generating stations (not shown) that produce electric power (not shown), electrical substations (not shown) for stepping electrical voltage up for transmission or stepping electrical voltage down for distribution, high voltage transmission lines (not shown), and distribution lines (not shown).

Figure 2:
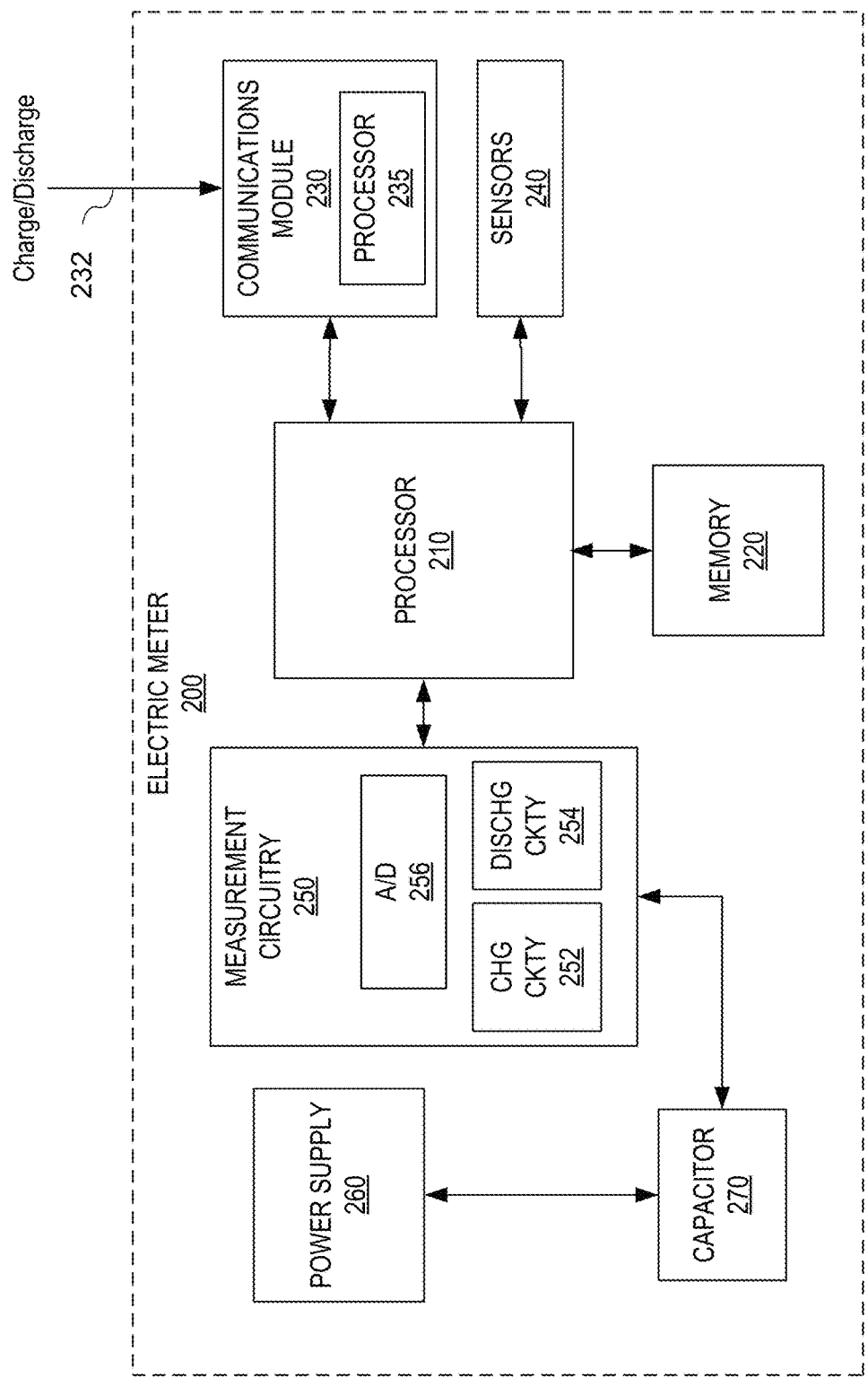
FIG. 2 is a block diagram illustrating an example of an electric meter according to some aspects of the present disclosure.

FIG. 2 is a block diagram illustrating an electric meter 200 according to some aspects of the present disclosure. The electric meter 200 may be, for example, the electric meter 105 of FIG. 1. The electric meter 200 may include a processor 210, a memory 220, a communications module 230, various sensors 240, capacitor measurement circuitry 250, a power supply 260, and a capacitor 270.

The processor 210 may be a general purpose processor, a digital signal processor (DSP), an application specific integrated circuit (ASIC), a field programmable gate array (FPGA) or other programmable logic device. The processor 210 may be in electrical communication with the memory 220, the communications module 230, and the sensors 240. The processor 210 may control overall operation of the electric meter 200. The processor 210 may receive data generated by various sensors 240 of the electric meter 200 including, but not limited to, energy use, voltage, current, etc., and may perform operations on, or processing of, the data. The processor 210 may communicate with the communications module 230 to transmit various operational parameters (e.g., energy usage), diagnostic data (e.g., error conditions), or other electric meter information (e.g., GPS coordinates) to a head-end system and/or to other electric meters via a wired or wireless network.

The memory 220 may be a storage device such as a solid state storage device or other storage device, and may be a combination of volatile and non-volatile storage or memory. In some implementations, portions of the memory may be included in the processor 210. The memory 220 may be configured to store instructions executable by the processor 210, as well as data generated by the various sensors 240 of the electric meter 200, and other applications executable by the processor 210.

The communications module 230 may be a wired or wireless transceiver operable to communicate via various wired or wireless protocols as known in the field for example, but not limited to the AMI protocols. The communications module 230 may include a processor 235. The communications module 230 may enable the electric meter 200 to communicate with other electric meters in a network (e.g., an AMI network) and with the utility provider (e.g., a head-end system) controlling the network. The communications module 230 may transmit data and alarm signals to the utility provider and receive any of updated program instructions, firmware updates, updates to other settings, or other communications. The communications module 230 may receive capacitor charge and discharge instruction signals 232 from the head-end system (e.g., the head-end system 110) and may communicate the instruction signals to the processor 210.

The sensors 240 may include, but are not limited to, voltage sensors, current sensors, accelerometers, tilt switches, temperature sensors, and other sensors configured to monitor electrical and physical characteristics of the electric meter 200.

The capacitor measurement circuitry 250 may include charging circuitry 252 and discharging circuitry 254 for the capacitor 270. The capacitor measurement circuitry 250 may measure the capacitor voltage and may convert the capacitor voltage values to digital values, for example, with an analog-to-digital (A/D) converter 256. The capacitor voltage may be measured during charging and/or during discharging. The capacitor measurement circuitry 250 may communicate the digital values to the processor 210 for further processing. The capacitor voltage measurements may be used to determine whether the capacitor is degraded.

The charging circuitry 252 may be a constant voltage charging circuit or a constant current charging circuit as known to those of skill in the art. The discharging circuitry 254 may be a constant current discharging circuit or a constant load charging circuit (e.g., a resistive load) as known to those of skill in the art. The A/D converter 256 may have sufficient resolution and sampling frequency to capture capacitor voltage measurements.

The power supply 260 may be a direct current (DC) power supply and may derive a primary alternating current (AC) voltage from the grid to which the electric meter 200 is connected. The power supply 260 may rectify the primary AC voltage to generate DC power. The DC power supply 260 may supply power to the components of the electric meter 200.

The capacitor 270 may provide power to the electric meter 200 for a short period of time immediately after a power outage. The capacitor 270 may an electric double layer capacitor (EDLC), also referred to as an ultracapacitor or supercapacitor, or another type of capacitor. The capacitor 270 may provide sufficient power for the electric meter 200 to transmit a "last gasp" message to the head-end system. The last gasp message may include a notification of the power outage as well as other information (e.g., energy usage, error conditions, or other electric meter information) at the time power was lost.

Figure 3:
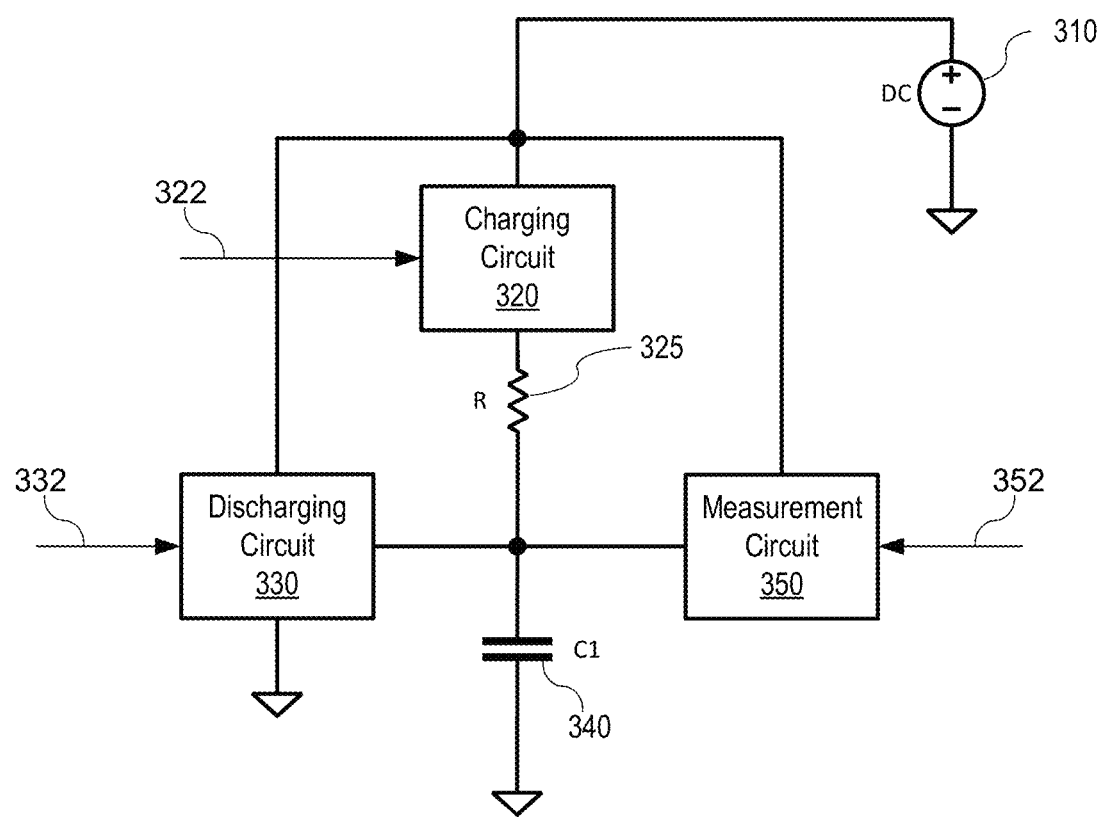
FIG. 3 is a block diagram illustrating a configuration an example of a configuration of charging, discharging, and measurement circuits for a capacitor in an electric meter according to some aspects of the present disclosure.

FIG. 3 is a block diagram illustrating a configuration an example of a configuration of charging, discharging, and measurement circuits for a capacitor in an electric meter according to some aspects of the present disclosure. Referring to FIG. 3, the DC power supply 310 may supply power to the charging circuit 320, the discharging circuit 330, and the capacitor measurement circuit 350. The charging circuit 320 may charge the capacitor 340. The capacitor 340 may be, for example, the capacitor 270 of FIG. 2. The charging, discharging, and measurement circuits may be existing charging, discharging, and measurement circuits of the electric meter, and may be used with existing processes to determine the condition of the capacitor.

The charging circuit 320 may be controlled by a processor, for example, by the processor 210, or another processor included in the electric meter, and may receive capacitor charging instruction signals 322 from the processor. The charging circuit 320 may provide a voltage or current to charge the capacitor. For example, the charging circuit 320 may be a constant current charging circuit or a constant voltage charging circuit. The charging circuit 320 may include a resistor 325 or other device to limit the charging current. When a capacitor voltage measurement performed by the capacitor measurement circuit 350 indicates that the capacitor voltage has fallen below a specified threshold voltage, the charging circuit 320 may charge the capacitor 340. The charging circuit 320 may also charge the capacitor 340 at predetermined intervals or upon receipt of a command from the head end system. The charging circuit 320 may charge the capacitor 340 up to the power supply voltage or another predetermined voltage. The degree of degradation of the capacitor 340 may be determined based on capacitor voltage measurements during the charging period.

The discharging circuit 330 may be controlled by a processor, for example, by the processor 210, or another processor included in the electric meter, and may receive capacitor discharging instruction signals 332 from the processor. The discharging circuit 330 may discharge the capacitor 340 when the capacitor voltage measured by the capacitor measurement circuit 350 exceeds a predetermined threshold value. For example, the capacitor voltage may increase with temperature or the capacitor 340 may become overcharged by the charging circuit 320. The discharging circuit 330 may also discharge the capacitor 340 at predetermined intervals or upon receipt of a command from the head end system. The discharging circuit 330 may provide a voltage or current to charge the capacitor. For example, the discharging circuit 330 may be a constant current discharging circuit or a constant load discharging circuit. The discharging circuit 330 may discharge the capacitor 340 down to zero volts or another predetermined voltage. The degree of degradation of the capacitor 340 may be determined based on capacitor voltage measurements during the discharging period.

The capacitor measurement circuit 350 may be controlled by a processor, for example, by the processor 210, or another processor included in the electric meter, and may receive capacitor voltage measurement instruction signals 352 from the processor. The capacitor measurement circuit 350 may include an analog-to-digital (A/D) converter (e.g., the A/D converter 256) configured to sense capacitor voltage and convert the sensed capacitor voltage values to digital values. In some implementations, the A/D converter may be part of the processor, for example, the processor 210, or another processor included in the electric meter. The A/D converter may have sufficient resolution and sampling frequency to capture capacitor voltage measurements. For example, the A/D converter may have sufficient resolution and sampling frequency to capture a step change in capacitor voltage indicative of the capacitor ESR at the start of a discharge period. The capacitor voltage measurements obtained by the capacitor measurement circuit 350 may be transmitted to the head-end system by the communications module (e.g., the communications module 230).

Figure 4A:
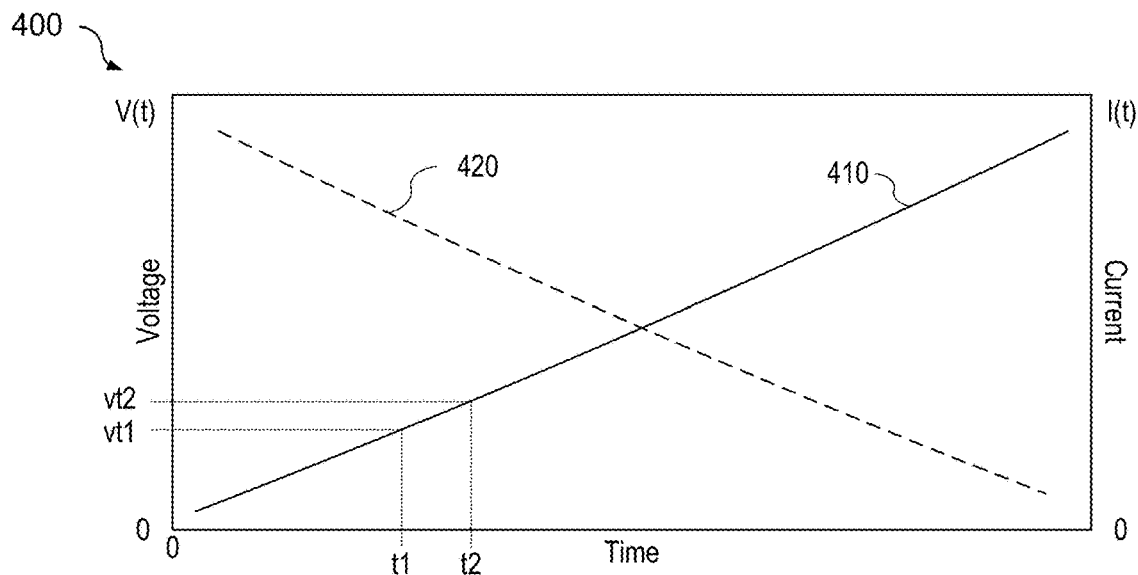
FIG. 4A is a plot illustrating an example of capacitor voltage and capacitor current versus time during a charging period of a capacitor in an electric meter according to some aspects of the present disclosure.

FIG. 4A is a plot 400 illustrating an example of capacitor voltage and capacitor current versus time during a charging period of a capacitor in an electric meter according to some aspects of the present disclosure. As illustrated in FIG. 4A, during the charging period, the capacitor voltage 410 increases while the capacitor current 420 decreases. The capacitance value of the capacitor 340 may be determined based on voltage measurements obtained during the charging period.

Referring to FIG. 4A, a first capacitor voltage value vt1 may be obtained during the charging period at a first time t1, and a second capacitor voltage value vt2 may be obtained during the charging period at a second time t2. The time interval from t1 to t2 may be small compared to the time required for the capacitor 340 to charge up to the power supply voltage. The A/D converter of the capacitor measurement circuit 350 may sample the capacitor voltage at times t1 and t2 during the charging period. The capacitor voltage measurements may be obtained during an approximately linear portion of the charging (or discharging) curve after the ESR voltage drop occurs. The sampling times may be determined by the processor (e.g., the processor 210 or another processor) or may be otherwise determined. The sampling time may be based on the resolution of the A/D converter and the acceptable level of error. For example, with a full scale voltage of 3.3 V, a 12-bit A/D converter can provide a resolution of $3.3/2^{12}=0.8$ mV. With a charge or discharge rate of 1 V/minute, a sampling time of 1 second may cause an error of 0.8 mV/16.67 mV=0.048 or 4.8%. A longer sampling period may provide a lower error. The A/D converter may communicate the capacitor voltage values vt1 and vt2 to the processor.

The processor may determine a capacitance value of the capacitor 340 based on the measured capacitor voltage values and the time interval during which the capacitor voltage values were obtained. The processor may determine the capacitance of the capacitor 340 using equation 1:

$$\text{Capacitance} = \frac{Idt}{dV} \qquad (1)$$

where dt may be the time interval t2-t1, dV may be the difference between the capacitor voltage values vt2 and vt1 at t2 and t1, respectively, and I may be the average current between times t1 and t2. The average current, I, may be calculated by equation (2):

$$I = \frac{(Vps - vt2) + (Vps - Vt1)}{2R} \qquad (2)$$

where Vps is the power supply voltage or other predetermined voltage to which the capacitor is charged, and R is the value of the resistor 325 in FIG. 3. The capacitance value of the capacitor may then be determined as equation (3):

$$\text{Capacitance} = \frac{Idt}{dV} = \frac{(Vps - vt2) + (Vps - vt1)}{2R} \cdot \frac{t2 - t1}{vt2 - vt1} \quad (3)$$

Since the charge time of the capacitor 340 may be assumed to be long compared to the measurement interval (t2-t1), the calculated average current during the interval may be assumed to be linear, and the resulting error negligible. The charge time of the capacitor 340 may be dependent on the charging circuitry designed to work with the power supply capabilities and requirements of the system using that power supply. The measurement interval selected should be of a time frame where the voltage charge slope is approximately linear. The measurement interval may scale with the total time to charge the capacitor, such that for faster charging of the capacitor the interval between t1 and t2 may be reduced by the same factor that total charge time was reduced. The capacitance calculations may be performed by one of the processors of the electric meter (e.g., the processor 210, the processor 235, or another processor) or by a processor of the head-end system.

Figure 4B:
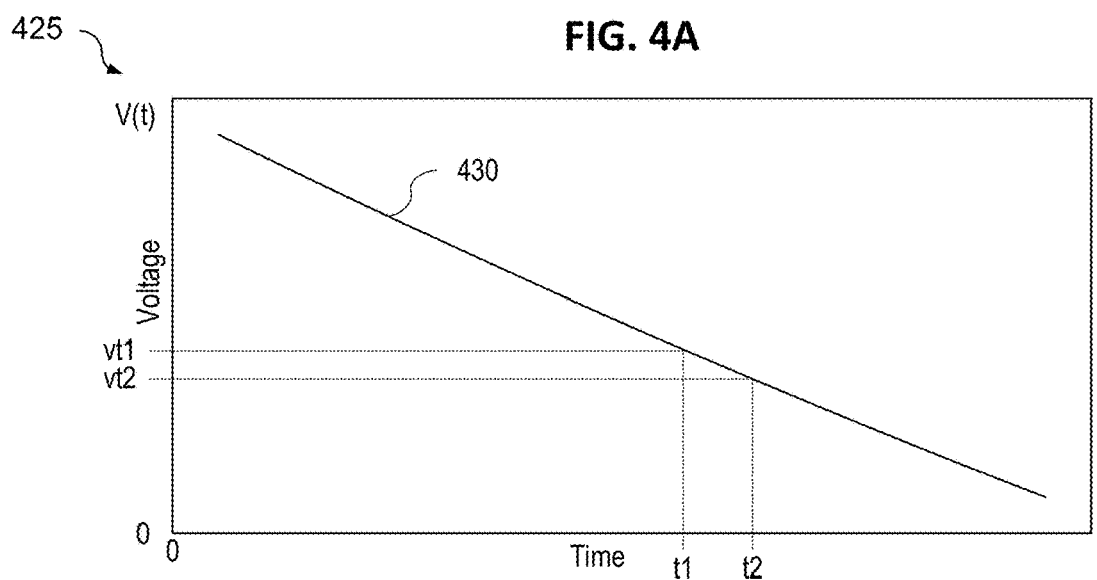
FIG. 4B is a plot 450 illustrating an example of an initial step in capacitor voltage at the start of the discharge period of a capacitor in an electric meter according to some aspects of the present disclosure.

While the above example of determining capacitance is provided using measurements obtained during a capacitor charging period, the capacitance value of the capacitor may be similarly determined based on voltage measurements obtained during the discharging period as illustrated in FIG. 4B. FIG. 4B is a plot 425 illustrating an example of capacitor voltage 430 versus time during a discharging period of a capacitor in an electric meter according to some aspects of the present disclosure. During the discharging period, the capacitance value of the capacitor may be determined as equation (4):

$$\text{Capacitance} = \frac{Idt}{dV} = \frac{(Vps - vt1) + (Vps - vt2)}{2R} \cdot \frac{t2 - t1}{vt1 - vt2} \quad (4)$$

The capacitance value of the capacitor may be compared to a threshold value, for example, a minimum specified capacitance value below which the capacitor may be considered to be degraded. When it is determined that the capacitance value of the capacitor falls below the threshold, it may be determined that the capacitor is degraded and should be replaced. In some cases, it may be determined that the capacitance value of the capacitor is decreasing at a rate that exceeds a specified threshold rate based on historical capacitance data. In either case, preemptive maintenance may them be performed prior to failure of the capacitor.

In some cases, the electric meter may report the measured capacitance to the head-end system, and the head-end system may identify that the capacitance is an outlier in a group of comparable electric meters. Comparable electric meters may be, for example, electric meters having one or more similar characteristics such as using the same capacitors, having similar age, etc. In some cases, the head-end system may update the threshold values (e.g., capacitance, rate of change of capacitance) based on historical data or based on information reported by other electric meters in a same group of meters. The head-end system may transmit the updated threshold values to the electric meter.

Figure 4C:
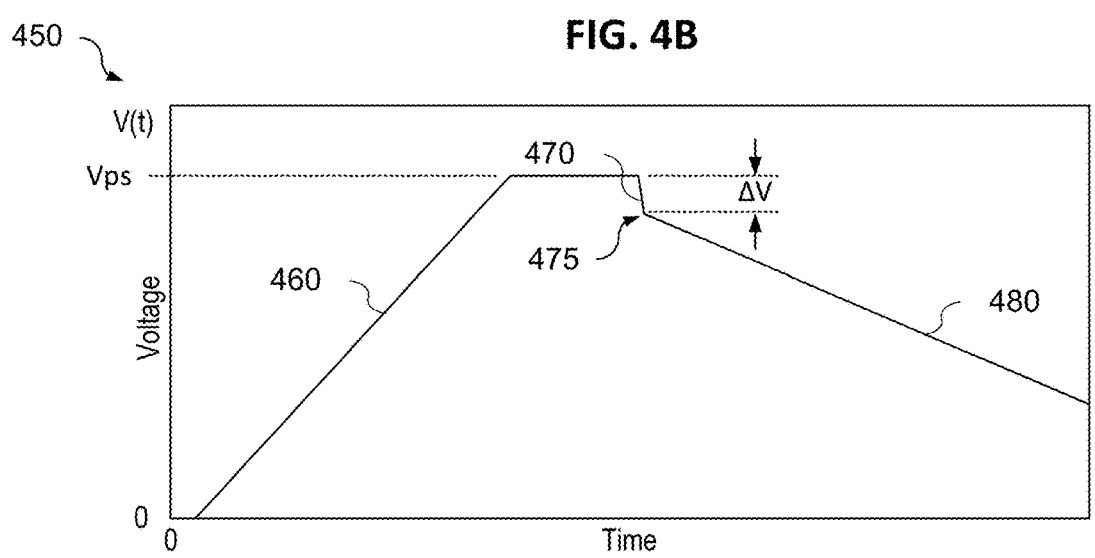
FIG. 4C is a plot illustrating an example of an initial step in capacitor voltage at the start of the discharge period of a capacitor in an electric meter according to some aspects of the present disclosure.

In addition, change in ESR value of the capacitor may be estimated from an initial "step" voltage drop in the capacitance voltage during the discharging period. A larger initial step in the discharge voltage may indicate increasing capacitor ESR when compared to previously obtained step discharge values. FIG. 4C is a plot 450 illustrating an example of an initial step in capacitor voltage at the start of the discharge period of a capacitor in an electric meter according to some aspects of the present disclosure.

Referring to FIG. 4C, the capacitor may be charged until the capacitor voltage 460 reaches a predetermined value, for example, the power supply voltage Vps or another predetermined voltage. During discharge, the capacitor voltage may experience an initial "step" voltage drop 470 from the predetermined voltage value prior to discharging at a rate 480 determined by the discharge circuit. The capacitor measurement circuit may obtain capacitor voltage values at the predetermined voltage value and at the point of the slope change 475 of the discharge voltage. The initial step voltage drop may increase as the ESR of the capacitor increases.

The initial step voltage drop, ΔV, value between the predetermined voltage value (e.g., Vps) and the voltage value at the point of the slope change 475 of the discharge voltage may be determined by the processor (e.g., the processor 210, the processor 235, or another processor). The step change in voltage may be proportional to the ESR of the capacitor. The ΔV value may be compared to previous values of ΔV. The comparison may be performed by one of the processors of the electric meter or by a processor of the head-end system. A larger ΔV value than in previous capacitor voltage measurements may be an indication of degradation of the capacitor (e.g., increased ESR).

In some cases, it may be determined that the ΔV value of the capacitor is increasing at a rate that exceeds a specified threshold rate based on historical data. In some cases, the ΔV value of the capacitor may be compared to a threshold value, for example, a maximum specified ΔV value corresponding to excessive ESR. When it is determined that the increase in the ΔV value exceeds a specified threshold rate or the ΔV value of the capacitor exceeds a threshold, it may be determined that the capacitor is degraded and should be replaced. A notification may be generated to the head-end system, and preemptive maintenance may them be performed prior to failure of the capacitor.

Figure 5:
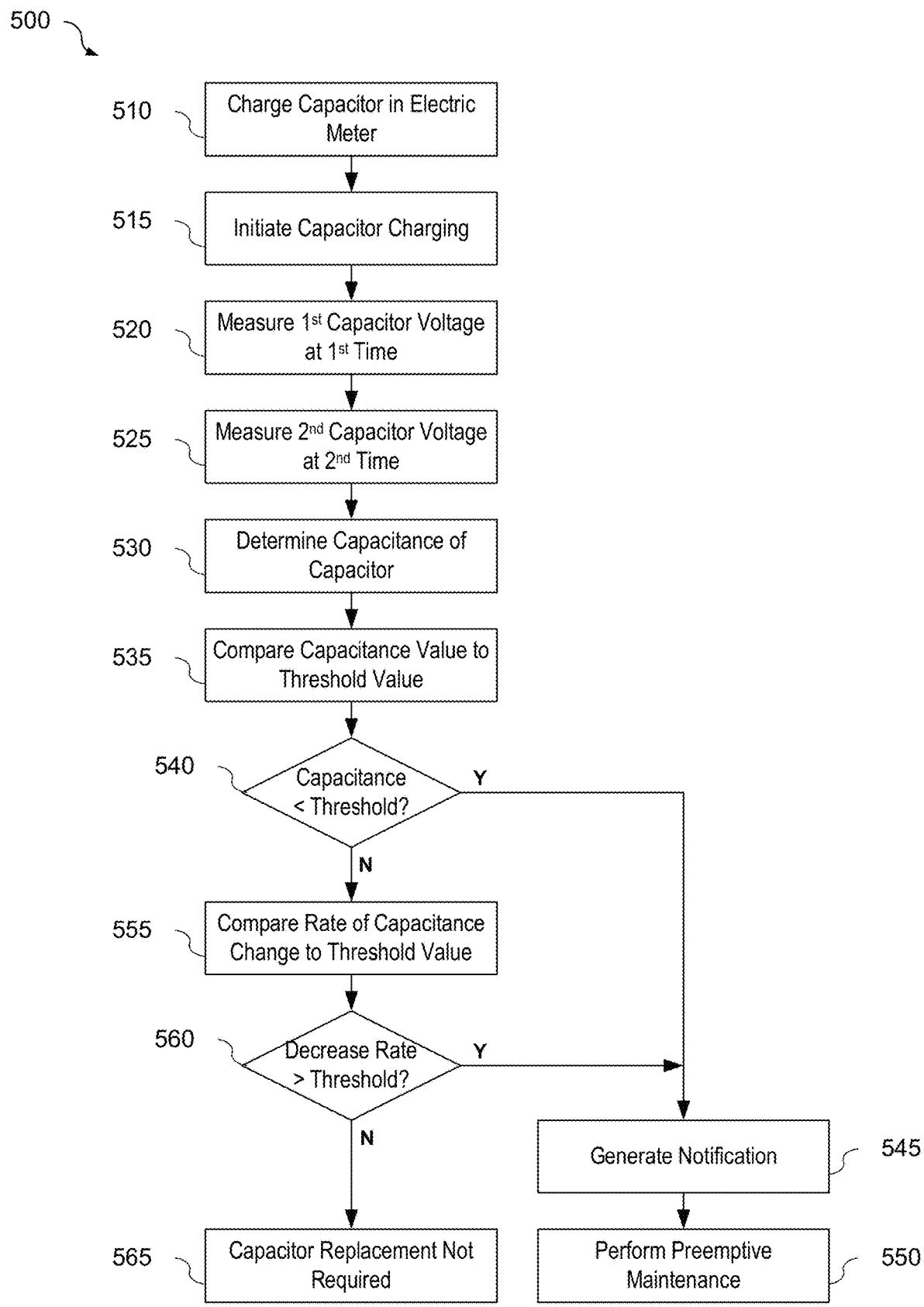
FIG. 5 is a flowchart illustrating an example of a method for determining capacitance of a capacitor in an electric meter according to some aspects of the present disclosure.

FIG. 5 is a flowchart illustrating an example of a method 500 for determining capacitance of a capacitor in an electric meter according to some aspects of the present disclosure. Referring to FIG. 5, at block 510, the capacitor may be charged. For example, the capacitor may be charged using the charging circuitry of the electric meter. The charging circuitry may be a constant voltage charging circuit or a constant current charging circuit. The charging circuitry may charge the capacitor up to a predetermined voltage, for example, the power supply voltage (Vps) or another predetermined voltage.

At block 515, discharging of the capacitor may be initiated. For example, referring to FIG. 4B, the processor may cause the discharging circuitry (e.g., the discharging circuit 330) to begin discharging the capacitor. The discharging circuitry may be a constant load circuit or a constant current discharging circuit.

At block 520, a first capacitor voltage measurement may be obtained at a first time. During discharging of the capacitor, the capacitor measurement circuitry (e.g., the capacitor measurement circuitry 250) may measure the capacitor voltage and may convert the capacitor voltage values to digital values, for example, with an analog-to-digital (A/D) converter.

At block 525, a second capacitor voltage measurement may be obtained at a second time. During discharging of the capacitor, the capacitor measurement circuitry (e.g., the capacitor measurement circuitry 250) may measure the capacitor voltage at a second time later than the first time, and may convert the capacitor voltage values to digital values, for example, with an analog-to-digital (A/D) converter.

At block 530, the capacitance of the capacitor may be determined. The processor may determine a capacitance value of the capacitor based on the measured capacitor voltage values and the time interval during which the capacitor voltage values were obtained, for example, using equation (4) above. The capacitance calculations may be performed by one of the processors of the electric meter (e.g., the processor 210, the processor 235, or another processor) or by a processor of the head-end system.

At block 535, the capacitance value may be compared to a threshold capacitance value. The threshold capacitance value may be a specified minimum capacitance value below which the capacitor may be considered to be degraded.

At block 540, it may be determined whether the capacitance value is lower than the specified threshold value. In response to determining that the capacitance value is lower than the specified threshold value (540-Y), at block 545, a notification may be generated to the head-end system. At block 550, preemptive maintenance may be performed based on the notification. For example, the capacitor or the electric meter may be replaced prior to failure of the capacitor.

In response to determining that the capacitance value is not lower than the specified threshold value (540-N), at block 555, the rate of change of the capacitance value may be compared to a threshold rate of change. The specified threshold rate of change may be may be determined, for example, based on historical data of capacitance changes over time.

At block 560, it may be determined whether the rate of decrease of the capacitance value exceeds a specified threshold rate. In response to determining that the capacitance value of the capacitor is decreasing at a rate that exceeds the specified threshold rate (560-Y), at block 545, a notification may be generated to the head-end system. At block 550, preemptive maintenance may be performed based on the notification. For example, the capacitor or the electric meter may be replaced prior to failure of the capacitor.

In response to determining that the rate of decrease of the capacitance value of the capacitor does not exceed the specified threshold decrease rate (560-N), at block 565 it may be determined that replacement of the capacitor is not required. Further testing, for example, ESR testing, may subsequently determine that replacement of the capacitor is needed.

While the method for determining capacitance of a capacitor in an electric meter is described as being performed during discharging of the capacitor, the method for determining capacitance of a capacitor in an electric meter may be similarly performed during charging of the capacitor without departing from the scope of the present disclosure. For example, referring to FIG. 4A, a first capacitor voltage value vt1 may be obtained during the charging period at a first time t1, and a second capacitor voltage value vt2 may be obtained during the charging period at a second time t2. The time interval from t1 to t2 may be small compared to the time required for the capacitor 340 to charge up to the power supply voltage. The A/D converter of the capacitor measurement circuit 350 may sample the capacitor voltage at times t1 and t2 during the charging period. The processor may determine a capacitance value of the capacitor based on the measured capacitor voltage values and the time interval during which the capacitor voltage values were obtained, for example, using equation (3) above.

The specific operations illustrated in FIG. 5 can provide a particular method for determining capacitance of a capacitor in an electric meter according to an embodiment of the present disclosure. Other sequences of operations may also be performed according to alternative embodiments. For example, alternative embodiments of the present disclosure may perform the operations outlined above in a different order. Moreover, the individual operations illustrated in FIG. 5 may include multiple sub-operations that may be performed in various sequences as appropriate to the individual operation. Furthermore, additional operations may be added or removed depending on the particular applications.

The method 500, may be embodied on a non-transitory computer readable medium, for example, but not limited to, the memory 220 or other non-transitory computer readable medium known to those of skill in the art, having stored therein a program including computer executable instructions for making a processor, computer, or other programmable device execute the operations of the methods.

Figure 6:
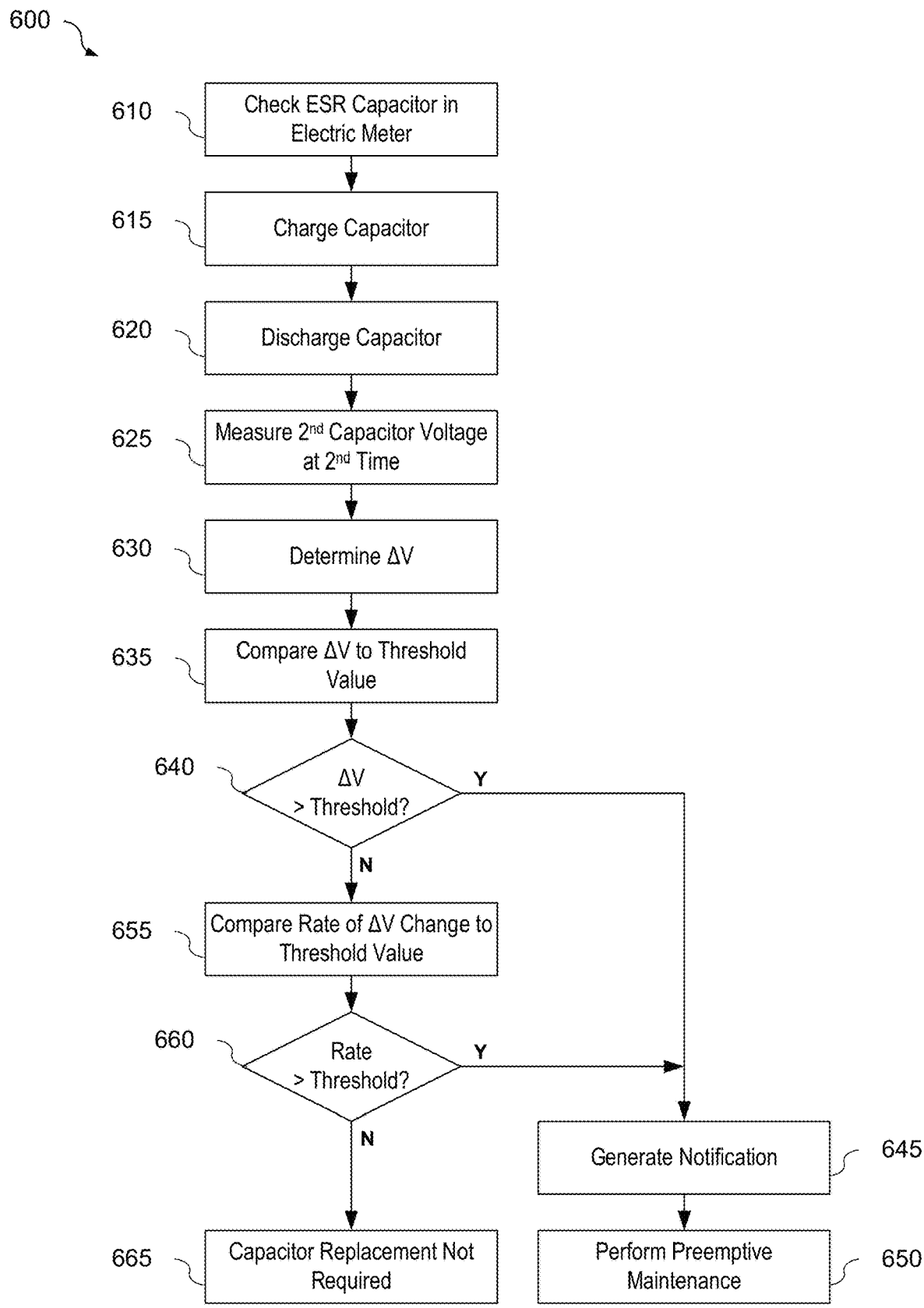
FIG. 6 is a flowchart illustrating an example of a method for estimating equivalent series resistance (ESR) of a capacitor in an electric meter according to some aspects of the present disclosure.

FIG. 6 is a flowchart illustrating an example of a method 600 for estimating equivalent series resistance (ESR) of a capacitor in an electric meter according to some aspects of the present disclosure. Referring to FIG. 6, at block 610, it may be determined that a check of the ESR value of the capacitor (e.g., the capacitor 340) in the electric meter should be performed. The check of the ESR value may be performed at predetermined intervals or upon receipt of a command from the head end system.

At block 615, the capacitor may be charged. For example, the processor may cause the charging circuitry (e.g., the charging circuit 320) to charge the capacitor. The charging circuitry may charge the capacitor up to a predetermined voltage, for example, the power supply voltage or another predetermined voltage. The charging circuitry may be a constant voltage charging circuit or a constant current charging circuit.

At block 620, the voltage on the capacitor may be discharged. During discharge by a discharging circuit (e.g., the discharging circuit 330), the capacitor voltage may experience an initial "step" voltage drop prior to discharging at a rate determined by the discharge circuit. The plot of FIG. 4 illustrates the capacitor voltage discharge.

At block 625, the capacitor voltage may be measured. The capacitor measurement circuitry (e.g., the capacitor measurement circuitry 250) may obtain capacitor voltage values at the predetermined voltage value and at the point of the slope change of the discharge voltage (e.g., the voltage of the step change. The capacitor measurement circuitry (e.g., the capacitor measurement circuitry 250) may measure the capacitor voltage and may convert the capacitor voltage values to digital values, for example, with an analog-to-digital (A/D) converter.

At block 630, the ΔV of the capacitor may be determined. The processor may determine a ΔV value of the capacitor voltage based on the measured capacitor voltage values at the time interval during which the capacitor voltage values were obtained. The ΔV calculations may be performed by one of the processors of the electric meter (e.g., the processor 210, the processor 235, or another processor) or by a processor of the head-end system.

At block 635, the ΔV value may be compared to a threshold ΔV value. The threshold capacitance value may be a specified maximum ΔV value above which the capacitor may be considered to be degraded.

At block 640, it may be determined whether the ΔV value exceeds the specified threshold value. In response to determining that the ΔV value exceeds the specified threshold value (640-Y), at block 645, a notification may be generated to the head-end system. At block 650, preemptive maintenance may be performed based on the notification. For example, the capacitor or the electric meter may be replaced prior to failure of the capacitor.

In response to determining that the ΔV value does not exceed the specified threshold value (640-N), at block 655, the rate of increase of the ΔV value may be compared to a threshold rate of increase. The specified threshold rate of increase may be may be determined, for example, based on historical data of ΔV changes over time.

At block 660, it may be determined whether the rate of increase of the ΔV value exceeds the specified threshold rate. In response to determining that the ΔV value of the capacitor is increasing at a rate that exceeds the specified threshold rate (660-Y), at block 645, a notification may be generated to the head-end system. At block 650, preemptive maintenance may be performed based on the notification. For example, the capacitor or the electric meter may be replaced prior to failure of the capacitor.

In response to determining that the ΔV value of the capacitor is not increasing at a rate that exceeds a specified threshold rate (660-N), at block 665 it may be determined that replacement of the capacitor is not required. Further testing, for example, to determine the capacitance value or change in capacitance value of the capacitor, may subsequently determine that replacement of the capacitor is needed.

The specific operations illustrated in FIG. 6 can provide a particular method for estimating ESR of a capacitor in an electric meter according to an embodiment of the present disclosure. Other sequences of operations may also be performed according to alternative embodiments. For example, alternative embodiments of the present disclosure may perform the operations outlined above in a different order. Moreover, the individual operations illustrated in FIG. 6 may include multiple sub-operations that may be performed in various sequences as appropriate to the individual operation. Furthermore, additional operations may be added or removed depending on the particular applications.

The method 600, may be embodied on a non-transitory computer readable medium, for example, but not limited to, the memory 220 or other non-transitory computer readable medium known to those of skill in the art, having stored therein a program including computer executable instructions for making a processor, computer, or other programmable device execute the operations of the methods.

The examples and embodiments described herein are for illustrative purposes only. Various modifications or changes in light thereof will be apparent to persons skilled in the art. These are to be included within the spirit and purview of this application, and the scope of the appended claims, which follow.

What is claimed is:

1. A method for determining degradation of a capacitor in an electric meter, the method comprising:
    providing, via a power supply, power to the electric meter;
    charging the capacitor to a predetermined voltage value during a charging period using capacitor charging circuitry of the electric meter, wherein the charging circuitry comprises circuitry separate from the power supply;
    discharging the capacitor, during a discharge period, from the predetermined voltage value using capacitor discharging circuitry of the electric meter, wherein the discharging circuitry comprises circuitry separate from the power supply;
    measuring, during the discharge period, a first voltage value of the capacitor at a first time and a second voltage value of the capacitor at a second time later than the first time using capacitor measurement circuitry of the electric meter;
    determining, by a processor of the electric meter, a capacitance value of the capacitor based on the first voltage value, the second voltage value, the first time, and the second time;
    comparing the determined capacitance value to a capacitance threshold value; and
    determining that the capacitor is in a degraded condition when the determined capacitance value is below the capacitance threshold value,
    wherein the capacitor is configured to provide power to the electric meter during an alternating current (AC) power outage.

2. The method of claim 1, further comprising:
    generating a notification to a head-end system that the capacitor is in a degraded condition.

3. The method of claim 1, wherein the capacitance threshold value is determined based on historical empirical capacitance data.

4. The method of claim 1, wherein the capacitor charging circuitry comprises a constant voltage charging circuit or a constant current charging circuit.

5. The method of claim 1, wherein the capacitor discharging circuitry comprises a constant load discharging circuit or a constant current discharging circuit.

6. The method of claim 1, further comprising estimating an equivalent series resistance (ESR) of the capacitor by:
    performing capacitor voltage measurements at a start of the discharge period, wherein the capacitor voltage measurements are performed over a series of time intervals shorter than a time interval between the first time and the second time;
    determining a change in slope of capacitor voltage based on the capacitor voltage measurements performed over the series of time intervals; and
    estimating the ESR of the capacitor based on the capacitor voltage measurements obtained between the start of the discharge period and a point of the change in slope of the capacitor voltage.

7. The method of claim 1, wherein the charging, discharging, and measuring of the capacitor voltage is performed on a predetermined schedule.

8. The method of claim 1, wherein the charging, discharging, and measuring of the capacitor voltage is performed in response to a command received by the electric meter.

9. The method of claim 1, wherein the capacitor is an electric double layer capacitor (EDLC).

10. An electric meter, comprising:
    a capacitor configured to provide power to the electric meter during an alternating current (AC) power outage;
    capacitor charging circuitry configured to charge the capacitor during a capacitor test;
    capacitor discharging circuitry configured to discharge the capacitor during the capacitor test;
    capacitor measurement circuitry configured to measure the capacitance of the capacitor during the capacitor test;
    a power supply configured to supply power to the capacitor charging circuitry and the capacitor discharging circuitry, wherein the capacitor charging circuitry and the capacitor discharging circuitry comprises circuitry separate from the power supply; and
    a processor, the processor configured to:

cause the capacitor charging circuitry to charge the capacitor to a predetermined voltage value during a charging period;
cause the capacitor discharging circuitry to discharge the capacitor from the predetermined voltage value during a discharge period;
cause the capacitor measurement circuitry to measure, during the discharge period, a first voltage value of the capacitor at a first time and a second voltage value of the capacitor at a second time later than the first time;
calculate a capacitance of the capacitor based on the first voltage value, the second voltage value, the first time, and the second time; and
compare the calculated capacitance to a capacitance threshold value.

11. The electric meter of claim 10, wherein the processor is further configured to generate a notification to a head-end system that the capacitor is in a degraded condition.

12. The electric meter of claim 10, wherein the capacitance threshold value is determined based on historical empirical capacitance data.

13. The electric meter of claim 10, wherein the capacitor charging circuitry comprises a constant voltage charging circuit or a constant current charging circuit.

14. The electric meter of claim 10, wherein the capacitor discharging circuitry comprises a constant load discharging circuit or a constant current discharging circuit.

15. The electric meter of claim 10, wherein the processor is further configured to estimate an equivalent series resistance (ESR) of the capacitor by:
causing the capacitor measurement circuitry to perform capacitor voltage measurements at a start of the discharge period, wherein the capacitor voltage measurements are performed over a series of time intervals shorter than a time interval between the first time and the second time;
determine a change in slope of capacitor voltage based on the capacitor voltage measurements performed over the series of time intervals; and
estimate the ESR of the capacitor based on the capacitor voltage measurements obtained between the start of the discharge period and a point of the change in slope of the capacitor.

16. The electric meter of claim 10, wherein processor is further configured to perform the charging, discharging, and measuring of the capacitor voltage on a predetermined schedule.

17. The electric meter of claim 10, wherein the processor is further configured to perform the charging, discharging, and measuring of the capacitor voltage in response to a command received by the electric meter.

18. The electric meter of claim 10, wherein the capacitor is an electric double layer capacitor (EDLC).

19. A system comprising:
a head-end system including a first processor; and
an electric meter coupled to the head-end system via a network, the electric meter including:
a capacitor configured to provide power to the electric meter during an alternating current (AC) power outage;
capacitor charging circuitry configured to charge the capacitor during a capacitor test;
capacitor discharging circuitry configured to discharge the capacitor during the capacitor test;
capacitor measurement circuitry configured to measure the capacitance of the capacitor during the capacitor test;
a power supply configured to supply power to the capacitor charging circuitry and the capacitor discharging circuitry, wherein the capacitor charging circuitry and the capacitor discharging circuitry comprises circuitry separate from the power supply; and
a second processor, the second processor configured to, upon receiving a command transmitted by the head-end system:
cause the capacitor charging circuitry to charge the capacitor to a predetermined voltage value during a charging period;
cause the capacitor discharging circuitry to discharge the capacitor from the predetermined voltage value during a discharge period;
cause the capacitor measurement circuitry to measure, during the discharge period, a first voltage value of the capacitor at a first time and a second voltage value of the capacitor at a second time later than the first time;
determine a capacitance value of the capacitor based on the first voltage value, the second voltage value, the first time, and the second time; and
in response to the command received from the head-end system, transmit the determined capacitance value to the head-end system,
wherein the first processor of the head-end system is configured to:
receive the transmitted capacitance value from the electric meter;
compare the determined capacitance value to a capacitance threshold value; and
determine that the capacitor is in a degraded condition when the determined capacitance value is below the capacitance threshold value.

20. The system of claim 19, wherein the second processor of the head-end system is further configured to generate a notification that the capacitor is in a degraded condition.

21. The system of claim 19, wherein the capacitance threshold value is determined based on historical empirical capacitance data.

22. The system of claim 19, wherein the capacitor is an electric double layer capacitor (EDLC).

* * * * *